United States Patent
Park et al.

(10) Patent No.: US 9,620,725 B2
(45) Date of Patent: Apr. 11, 2017

(54) POLYMER SOLAR CELL AND METHOD OF FORMING THE SAME

(71) Applicant: GWANGJU INSTITUTE OF SCIENCE AND TECHNOLOGY, Gwangju (KR)

(72) Inventors: Ji Woong Park, Gwangju (KR); Min Gu Han, Gwangju (KR); Hyung Soo Kim, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 568 days.

(21) Appl. No.: 14/026,313

(22) Filed: Sep. 13, 2013

(65) Prior Publication Data
US 2014/0216551 A1    Aug. 7, 2014

(30) Foreign Application Priority Data
Feb. 7, 2013    (KR) .......................... 10-2013-0013834

(51) Int. Cl.
*H01L 51/00* (2006.01)
*H01L 51/42* (2006.01)

(52) U.S. Cl.
CPC ...... *H01L 51/0094* (2013.01); *H01L 51/4253* (2013.01); *H01L 51/0036* (2013.01); *H01L 51/0039* (2013.01); *Y02E 10/549* (2013.01)

(58) Field of Classification Search
CPC ............. H01L 51/0094; H01L 51/4253; H01L 51/0039; H01L 51/0036
USPC ........................................................ 136/263
See application file for complete search history.

(56) References Cited

U.S. PATENT DOCUMENTS

2010/0024860 A1*  2/2010  He ..................... H01L 51/0043
136/244

FOREIGN PATENT DOCUMENTS

| JP | 2010067642 | 3/2010 |
|----|------------|--------|
| JP | 2012533170 A | 12/2012 |
| KR | 20100108640 | 10/2010 |
| KR | 20110089721 | 8/2011 |

OTHER PUBLICATIONS

Mingu Han et al., Photovoltaic Efficiency Enhancement by the Generation of an Embedded Silica-Like Passivation Layer along the P3HT/PCBM Interface Using an Asymmetric Block-Copolymer Additive, Article, 2012, Adv. Mater., 6311-6317pg, vol. 24, Wiley-VCH Verlag GmbH & Co. KGaA, Weinheim.

(Continued)

*Primary Examiner* — Jayne Mershon
(74) *Attorney, Agent, or Firm* — Hauptman Ham, LLP

(57) ABSTRACT

Provided is a polymer solar cell. The polymer solar cell includes a photoactive layer having a network-structured electron donor layer and a silica thin film layer surrounding the electron donor layer. By mixing of electron donor polymers, electron acceptor polymers, and block copolymers, the electron donor polymers form polymer grains through a self-assembly process. In addition, during a heat treatment process, silica precursors included in the block copolymers cross-link to each other to form the silica thin film. Electrons generated in the electron donor layer tunnel through the silica thin film, and holes are blocked by the silica thin film. Accordingly, electron-hole recombination in the electron acceptor layer is prevented.

6 Claims, 4 Drawing Sheets

(56) References Cited

OTHER PUBLICATIONS

Satoshi Honda et al., Light-Harvesting Mechanism in Polymer/Fullerene/Dye Ternary Blends Studied by Transient Absorption Spectroscopy, 2011, pp. 11306-11317, vol. 115, The Journal of Physical Chemistry.

* cited by examiner

200

POLYMER SOLAR CELL AND METHOD OF FORMING THE SAME

CLAIM FOR PRIORITY

This application claims priority to Korean Patent Application No. 2013-0013834 filed on Feb. 7, 2013 in the Korean Intellectual Property Office (KIPO), the entire contents of which are hereby incorporated by reference.

BACKGROUND

1. Technical Field

Example embodiments of the present invention relate in general to the field of polymer solar cells, and more specifically to a photoactive layer composite in which a silica thin film layer is formed between an electron donor layer and an electron acceptor layer, and a polymer solar cell using the same.

2. Related Art

A solar cell is a photonic device that generates electrons and holes to generate photovoltaic power from incident sunlight. A solar cell may be classified as an inorganic solar cell or an organic solar cell, according to the type of material that absorbs incident light to form excitons.

An inorganic solar cell is a silicon-based solar cell in which an inorganic material is formed in a deposition process, and electrical energy is generated from the stacked structure thereof. Inorganic solar cells have already been commercialized, and show high power conversion efficiency compared to other solar cells. However, there is a limit in application thereof due to properties of the inorganic materials. For example, the installation is possible in limited outdoor spaces, and since the inorganic solar cell has no flexibility, the direction of the solar cell needs to be modified depending on the incident angle of sunlight. In addition, high manufacturing costs are incurred due to limited reserve of materials and high material costs of thereof.

An organic solar cell uses an organic material as the photoactive layer. An organic solar cell is classified as a dye-sensitized solar cell or a polymer solar cell according to the type of the organic material. A polymer solar cell includes a photoactive layer in which an electron donor material and an electron acceptor material are mixed. A polythiophene (P3HT) polymer may be used as the electron donor, and fullerene may be used as the electron acceptor. The two materials are not completely mixed but formed to have several tens of nanometers of fine grains through phase separation, and have mutually three-dimensional random structures. The photoactive layer absorbs sunlight to generate excitons. The excitons are dissociated from an interface between the electron donor material and the electron acceptor material to be separated into electrons and holes, and the charges move to respective electrodes.

A polymer solar cell may have a structure in which an electrode and a photoactive layer are sequentially stacked. However, efficient moving and storing operations of separated charges are required between a plurality of distinguishably stacked layers. In order to achieve this, studies on inserting a functional interfacial layer between each electrode and the photoactive layer are being conducted.

The inserted interfacial layer is formed between the photoactive layer and the electrode, and solves the problem caused by a difference in a work function between the photoactive layer and the electrode, or increases the efficiency by generating appropriate dipole moments for moving charges in each electrode. In addition, the interfacial layer, such as $TiO_2$, ZnO, polyethylene glycol, or polyfluorene derivatives, prevents electron-hole recombination at an interface between the electrode and the photoactive layer.

However, since the above described interfacial material or interfacial layer is not formed inside the photoactive layer in which a photochemical process actually occurs, the interfacial material or interfacial layer may not control an internal operation of the photoactive layer, and may be stacked above or below the photoactive layer to control a moving or storing operation of already-generated electrons or holes in the electrode.

That is, there is a limit in that conventional methods of improving light-to-electric energy conversion efficiency may not control loss caused by the electron-hole recombination in the photoactive layer, and may function only to ease the movement of charges between the photoactive layer and the electrode. This is because the interface between the electron donor material and the electron acceptor material has an irregular three-dimensional microstructure, and therefore interfacial characteristics may not be controlled through a general stacking method.

SUMMARY

Accordingly, example embodiments of the present invention are provided to substantially obviate one or more problems due to limitations and disadvantages of the related art.

Example embodiments of the present invention provide a polymer solar cell in which a silica thin film layer is formed at an interface between an electron donor layer and an electron acceptor layer in a photoactive layer.

Example embodiments of the present invention also provide a method of fabricating a polymer solar cell in which a silica thin film layer is formed at an interface between an electron donor layer and an electron acceptor layer in a photoactive layer.

In some example embodiments, a polymer solar cell includes a lower electrode, a hole transport layer formed on the lower electrode, a photoactive layer formed on the hole transport layer in which tunneling of electrons occurs, and an upper electrode formed on the photoactive layer.

In other example embodiments, a method of fabricating a polymer solar cell includes forming a hole transport layer on a lower electrode, forming a photoactive layer on the hole transport layer, wherein the photoactive layer includes an electron donor layer having a self-assembled network structure, a silica thin film layer formed around the electron donor layer, and an electron acceptor layer, and forming an upper electrode on the photoactive layer.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
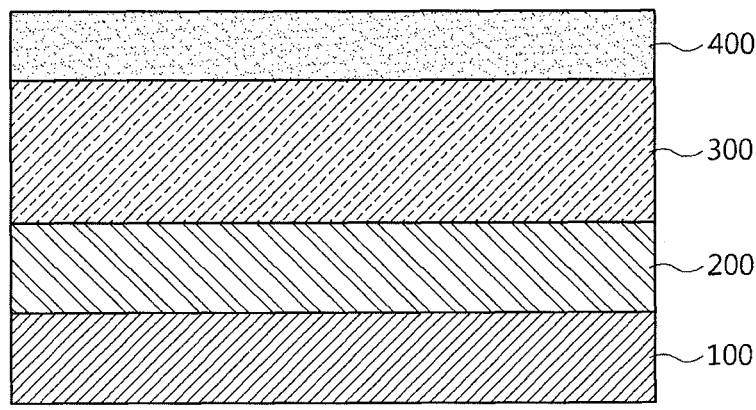
FIG. 1 is a cross-sectional view showing a polymer solar cell according to an example embodiment of the present invention.

Example embodiments of the present invention are disclosed herein. However, specific structural and functional details disclosed herein are merely representative for purposes of describing example embodiments of the present invention, and thus example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in reverse order, depending upon the functionality/acts involved.

EXAMPLE EMBODIMENTS

FIG. 1 is a cross-sectional view showing a polymer solar cell according to an example embodiment of the present invention.

Referring to FIG. 1, a polymer solar cell includes a lower electrode 100, a hole transport layer 200, a photoactive layer 300, and an upper electrode 400.

The lower electrode 100 is formed of a transparent conductive material. Accordingly, the lower electrode 100 may be formed of indium tin oxide (ITO) or indium zinc oxide (IZO), and may be a thin film type metal formed on an insulating substrate such as glass.

The hole transport layer 200 is formed on the lower electrode 100. The hole transport layer 200 may be poly(3,4-ethylenedioxythiophene):poly(styrenesulfonate) (PEDOT:PSS). In addition, any organic material that has a valence band sufficient to move holes generated in the photoactive layer 300 may be used.

The photoactive layer 300 may be formed on the hole transport layer 200. The photoactive layer 300 may include an electron donor polymer, an electron acceptor polymer, and a silica thin film formed between the electron donor polymer and the electron acceptor polymer.

The electron donor polymer may be a homo-polymer or an alternating polymer.

Poly(thiophene) derivatives used as the homo-polymer may be represented by the following chemical formula.

[Chemical formula 1]

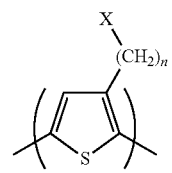

In Chemical formula 1, n represents a natural number of 1 to 12, and X represents a methyl, fluorine, or bromine group.

In addition, poly(fluorene) derivatives used as the homo-polymer may be represented by the following chemical formula.

[Chemical formula 2]

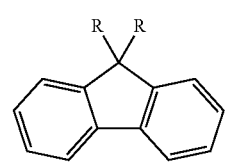

In Chemical formula 2, R represents an alkyl group (from methyl to octadecyl), an ethylhexyl group, or a 2-(2-methoxyethoxy)ethyl group.

Other homo-polymers such as poly(2-methoxy-5-(2-ethylhexyloxy)-1,4-phenylenevinylene) (MEH-PPV) or poly(2-methoxy-5-(3,7-dimethyloctyloxy)-1,4-phenylenevinylene) (MDMO-PPV) may be used as the homo-polymer.

In addition, poly(2,6-(4,4-bis-(2-ethylhexyl)-4H-cyclopenta(2,1-b:3,4-b)dithiophene)-alt-4,7(2,1,3-benzothiadiazole)) (PCPDTBT), poly((4,4'-bis(2-ethylhexyl)dithieno(3,2-b:2',3'-d)silole-2,6-diyl-alt-(2,1,3-benzothiadiazole)-4,7-diyl) (PSBTBT), or poly-dithieno(3,2-b:2',3'-d)germole thieno(3,4-c)pyrrole-4,6-dione (PDTG-TPD) may be used as the alternating polymer. Other alternating polymers such as poly(4,8-bis(2-ethylhexyloxy)-benzo(1,2-b:4,5-b)dithiophene-2,6-diyl-alt-(4-octanoyl-5-fluoro-thieno(3,4-b)thiophene-2-carboxylate)-2,6-diyl) (PBDTTT-CF), poly((4,8-bis((2-ethylhexyl)oxy)benzo(1,2-b:4,5-b')dithiophene-2,6-diyl)(3-fluoro-2-((2-ethylhexyl)carbonyl)thieno(3,4-b)thiophenediyl)) (PTB7), PCDTBT may be used as the alternating polymer.

In addition, any polymer material that performs an electron donating operation, as well as the above-mentioned polymers, may be used.

In addition, phenyl-C61-butyric-acid-methyl ester ($PC_{60}BM$), phenyl-C71-butyric-acid-methyl ester ($PC_{70}BM$), phenyl-C85-butyric-acid-methyl ester ($PC_{84}BM$), etc. may be used as the electron acceptor polymer, and a methyl group to an octyl group may be used as a functional group linked to the terminus of each electron accepting ester group. That is, any polymer that forms a lower conduction band level than the electron donor polymer may be used.

The silica thin film is formed between the electron acceptor polymer and the electron donor polymer. Electrons generated in the electron donor polymer tunnel through the silica thin film, and movement of holes is blocked by the silica thin film. That is, the electrons are transported from the electron donor polymer to the electron acceptor polymer by tunneling through the silica thin film, and electron-hole recombination generated by transporting of the holes to the electron acceptor polymer is blocked.

The formation of the silica thin film includes introducing a block copolymer. For example, the block copolymer consists of silica precursors introduced to one or both termini of the electron donor polymer. An acrylate group, a methacrylate group, a styrene group, an allyl group, an isocyanate group, etc. may be used as the silica precursors.

The acrylate group used as the silica precursor is represented by the following chemical formulae.

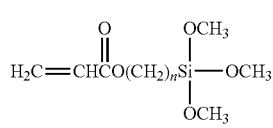

[Chemical formula 3]

In Chemical formula 3, n represents a natural number of 1 to 3, and when the number of methoxy groups combined with the Si atom is less than 3, the other group combined with the Si element is a methyl group.

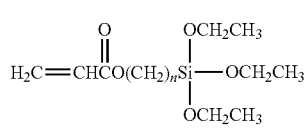

[Chemical formula 4]

In Chemical formula 4, n represents a natural number of 1 to 3, and when the number of ethoxy groups combined with the Si atom is less than 3, the other group combined with the Si element is a methyl group.

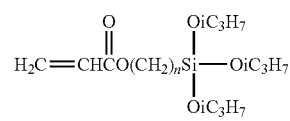

[Chemical formula 5]

In Chemical formula 5, n represents a natural number of 1 to 3, and when the number of isopropoxy groups combined with the Si atom is less than 3, the other group combined with the Si element is a methyl group.

In addition, the methacrylate group used as the silica precursor is represented by the following chemical formulae.

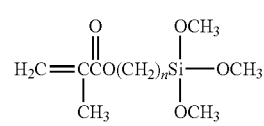

[Chemical formula 6]

In Chemical formula 6, n represents a natural number of 1 to 3, and when the number of methoxy groups combined with the Si atom is less than 3, the other group combined with the Si element is a methyl group.

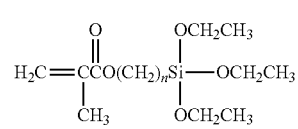

[Chemical formula 7]

In Chemical formula 7, n represents a natural number of 1 to 3, and when the number of ethoxy groups combined with the Si atom is less than 3, the other group combined with the Si element is a methyl group.

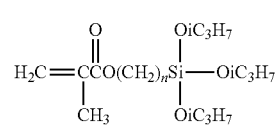

[Chemical formula 8]

In Chemical formula 8, n represents a natural number of 1 to 3, and when the number of isopropoxy groups combined with the Si atom is less than 3, the other group combined with the Si element is a methyl group.

In addition, the styrene group used as the silica precursor is represented by the following chemical formulae.

[Chemical formula 9]

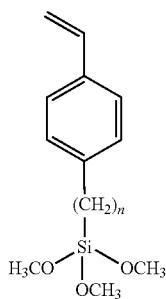

In Chemical formula 9, n represents a natural number of 1 to 3.

[Chemical formula 10]

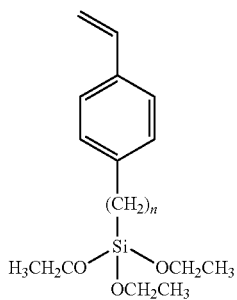

In Chemical formula 10, n represents a natural number of 1 to 3.

The allyl group used as the silica precursor is represented by the following chemical formulae.

$H_2C=CH(CH_2)_nSi(OCH_3)_3$ [Chemical formula 11]

In Chemical formula 11, n represents a natural number of 1 to 12, and when the number of methoxy groups combined with the Si atom is less than 3, the other group combined with the Si element is a methyl group.

$H_2C=CH(CH_2)_nSi(OCH_3CH_3)_3$ [Chemical formula 12]

In Chemical formula 12, n represents a natural number of 1 to 12, and when the number of ethoxy groups combined with the Si atom is less than 3, the other group combined with the Si element is a methyl group.

$H_2C=CHCH_2O(CH_2)_nSi(OCH_3)_3$ [Chemical formula 13]

In Chemical formula 13, n represents a natural number of 1 to 12, and when the number of methoxy groups combined with the Si atom is less than 3, the other group combined with the Si element is a methyl group.

$H_2C=CHCH_2O(CH_2)_nSi(OCH_3CH_3)_3$ [Chemical formula 14]

In Chemical formula 14, n represents a natural number of 1 to 12, and when the number of ethoxy groups combined with the Si atom is less than 3, the other group combined with the Si element is a methyl group.

The isocyanate group used as the silica precursor is represented by the following chemical formulae.

$NCO-(CH_2)_nSi(OCH_3)_3$ [Chemical formula 15]

In Chemical formula 15, n represents a natural number of 1 to 12, and when the number of methoxy groups combined with the Si atom is less than 3, the other group combined with the Si element is a methyl group.

$NCO-(CH_2)_nSi(OCH_3CH_3)_3$ [Chemical formula 16]

In Chemical formula 16, n represents a natural number of 1 to 12, and when the number of ethoxy groups combined with the Si atom is less than 3, the other group combined with the Si element is a methyl group.

The photoactive layer 300 is formed by dissolving the electron donor polymer, the electron acceptor polymer, and the block copolymer in a solvent with a predetermined mixing ratio to form a solution, and spreading the solution on the hole transport layer 200 using a spin coating method, etc. In the mixed solution used to form the photoactive layer 300, the electron donor polymer and the block copolymer form grains of the electron donor polymer by a self-assembly process. In addition, the silica precursor included in the block copolymer which interferes with the formation of the grains is located around the grains composed of the electron donor polymer.

The upper electrode 400 is formed on the photoactive layer 300.

The upper electrode 400 is formed using a conventional deposition process, and may include Al, Ca, or Mg. In addition, any conductive material that has a lower conduction band level than the photoactive layer 300 may be used as the upper electrode 400.

After the formation of the upper electrode 400 or the spreading of the photoactive layer 300, a heat treatment process is performed. The heat treatment is performed at a temperature of 140° C. to 200° C., for 5 to 30 minutes. Through the heat treatment, the silica precursors located around the grains of the electron donor polymers cross-link to each other. Through the cross-linking process, the silica thin film is coated around the electron donor polymers.

For example, when the silica precursor has a methyl group combined with silicon, the cross-linking process between the silica precursors is represented by the following reaction formula 1.

[Reaction formula 1]

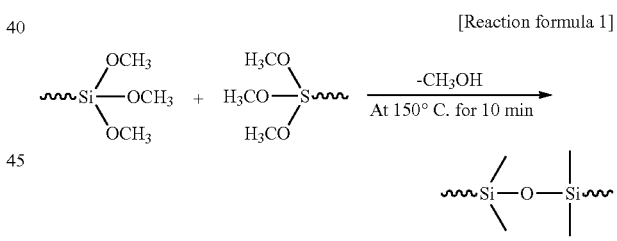

Figure 2:
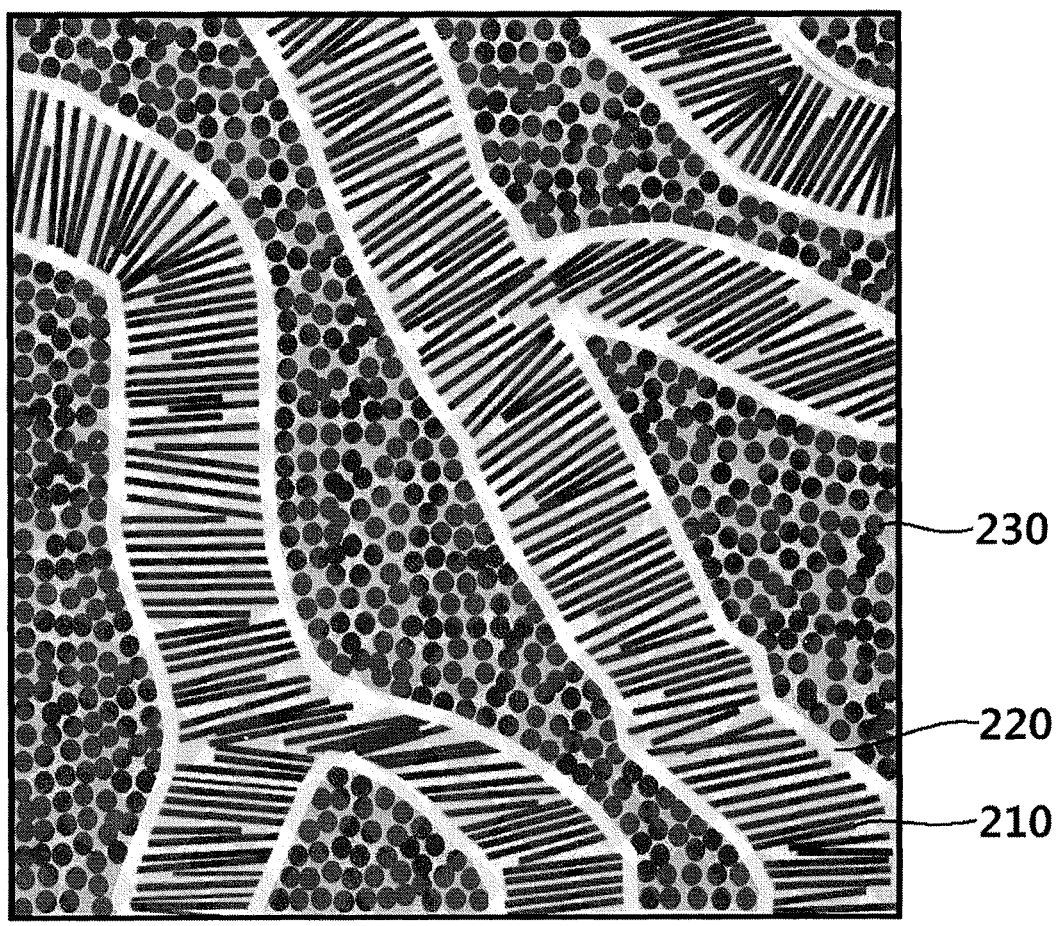
FIG. 2 is a schematic diagram showing a photoactive layer according to an example embodiment of the present invention.

FIG. 2 is a schematic diagram showing a photoactive layer according to an example embodiment of the present invention.

Referring to FIG. 2, the photoactive layer includes an electron donor layer 210 having electron donor polymers, an electron acceptor layer 230 having electron acceptor polymers, and a silica thin film layer 220.

The electron donor layer 210 may be formed by a self-assembly process of the electron donor polymers. That is, through the self-assembly process according to mixing of the electron donor polymers and block copolymers, the electron donor polymers may form polymer grains having a regular array.

The silica thin film layer 220 including silica is formed around the electron donor layer 210 composed of grains of the electron donor polymers. The silica thin film layer 220 is formed through a cross-linking process between the silica precursors by a heat treatment. Here, the silica thin film layer 220 is not composed of silica only, and the silica precursors involved in the cross-linking process are distributed in an outer area.

In addition, the electron acceptor layer 230 composed of the electron acceptor polymers is formed in the outside of the silica thin film layer 220.

In FIG. 2, in the photoactive layer, electrons generated in the electron donor layer 210 connected in a network structure move to the electron acceptor layer 230 by tunneling through the silica thin film layer 220. In addition, holes generated in the electron donor layer 210 are blocked by the silica thin film layer 220, and move along the electron donor layer 210 to a lower hole transport layer. Accordingly, recombination of holes and electrons generated by incident light in the electron acceptor layer 230 may be prevented.

<Example of Fabrication>

Indium tin oxide (ITO) glass is used as a lower substrate. The ITO glass is pre-treated for 15 minutes in soapy water, DI water, or an acetone or isopropyl-alcohol solution. Next, a UV ozone treatment is performed for 15 minutes.

A PEDOT:PSS layer having a thickness of 40 nm is formed as a hole transport layer on the ITO glass. The formation is performed by a general coating process.

Next, a photoactive layer is formed. In order to form the photoactive layer, poly(3-hexylthiophene) (P3HT) is used as an electron donor polymer, and [6,6]-phenyl-C60-butyric acid methyl ester (PCBM) is used as an electron acceptor polymer. In addition, poly(3-hexylthiophene-b-poly[(3-trimethoxysilyl)propyl methacrylate (P3HT-b-PTMSM) is used as a block copolymer consisting of the electron donor polymers and silica precursors. The three solutes are dissolved in a solvent composed of chlorobenzene to form a 2 wt/v % solution. As the solvent, dichlorobenzene, trichlorobenzene, chloroform, or toluene may be used rather than chlorobenzene.

In addition, the solution composed of P3HT/PCBM/block copolymer (P3HT-b-PTMSM) forms three kinds of solutions having different mixing ratios from each other. Next, the solutions are stirred at room temperature for about one hour. The fabricated solution is spin-coated on the PEDOT:PSS layer to form a photoactive layer having a thickness of 80 to 100 nm. Next, Al, an anode material, having a thickness of 100 nm is deposited, and a heat treatment process is performed at 150° C. for 10 minutes.

Figure 3:
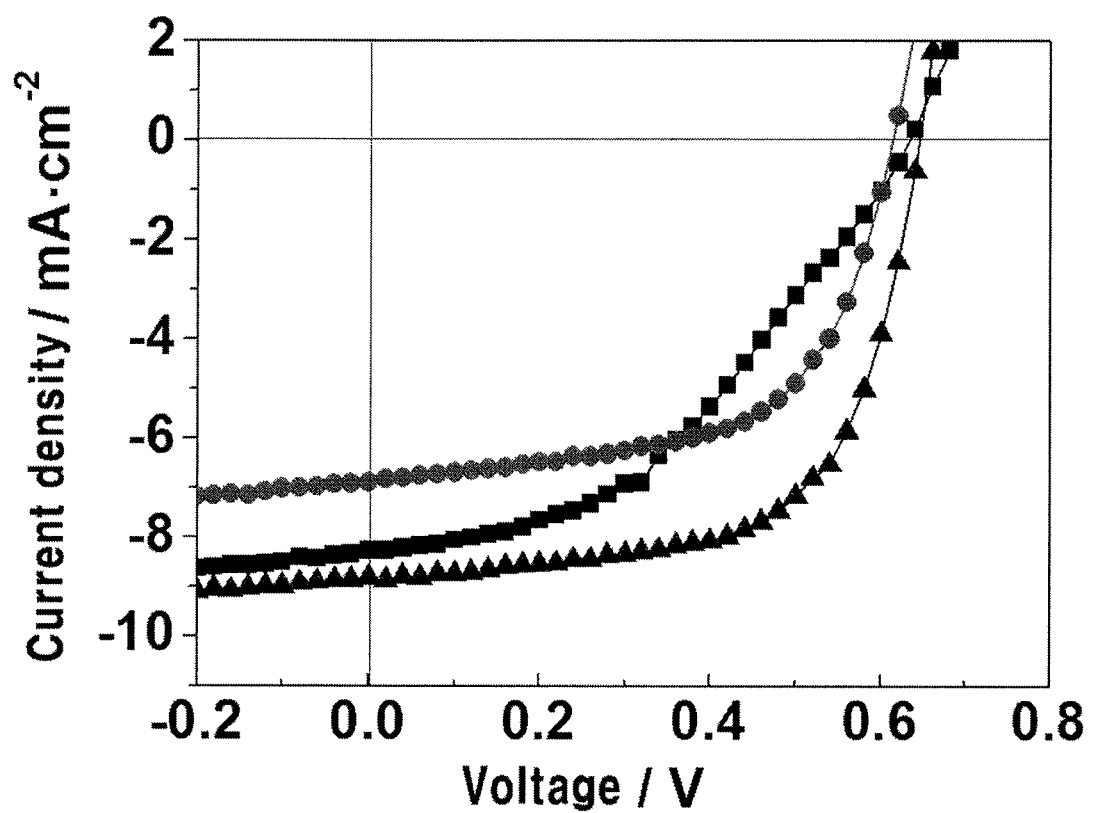
FIG. 3 is a graph showing current densities of various polymer solar cells formed according to an example of a fabrication method of the present invention.

FIG. 3 is a graph showing current densities of various polymer solar cells formed according to an example of a fabrication method of the present invention.

Referring to FIG. 3, "■" represents an example including a photoactive layer in which P3HT and PCBM are mixed at a ratio of 56:44, and "●" represents an example including a photoactive layer in which P3HT-b-PTMSM and PCBM are mixed at a ratio of 50:50. In addition, "▲" represents an example including a photoactive layer in which P3HT, PCBM, and P3HT-b-PTMSM are mixed at a ratio of 43.5:43.5:13.

In FIG. 3, the "▲" curve of the example in which the block copolymer is applied and the silica thin film is formed around the electron donor polymer shows a current density having a high absolute value, and substantially maintains the high current density even when the voltage increases. This means that tunneling of electrons through the silica thin film layer to the electron acceptor polymer is smooth, and leakage current generation due to electron-hole recombination in the electron acceptor polymer is blocked since tunneling of holes is blocked.

Figure 4:
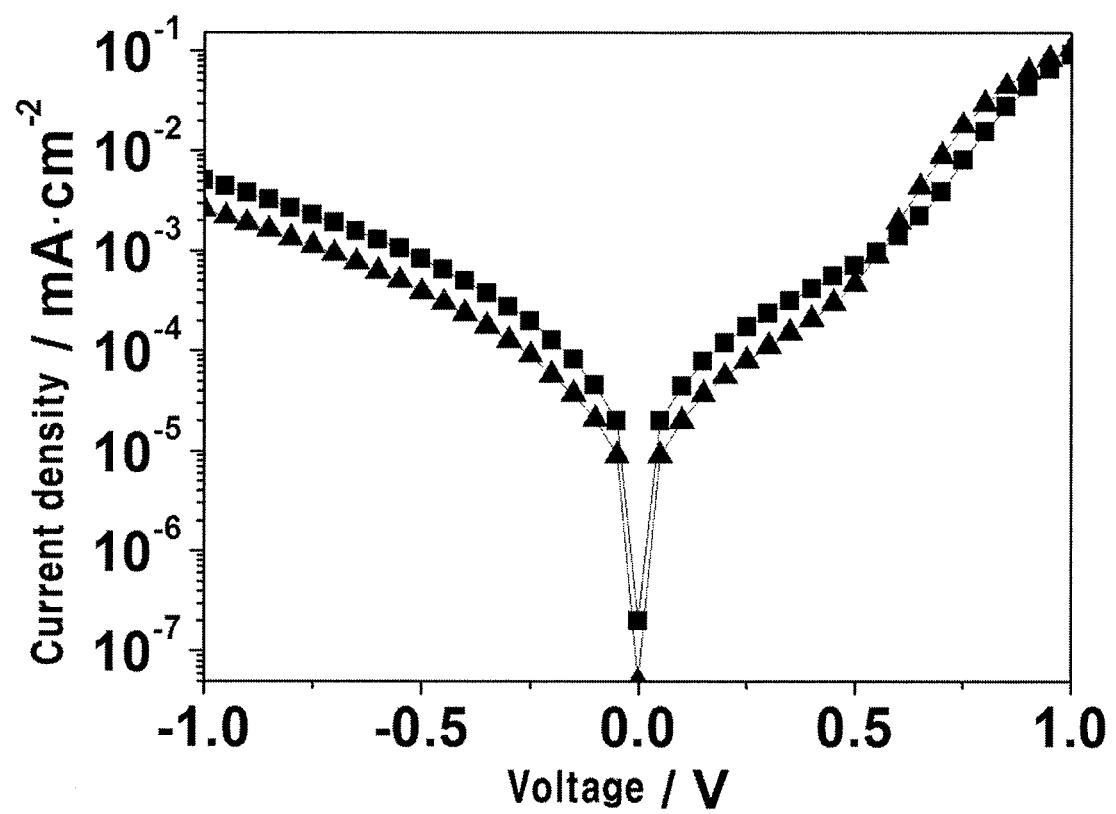
FIG. 4 is a graph showing dark currents of polymer solar cells formed according to an example of a fabrication method of the present invention.

FIG. 4 is a graph showing a dark current of polymer solar cells formed according to an example of a fabrication method of the present invention.

Referring to FIG. 4, "■" represents an example including a photoactive layer in which P3HT and PCBM are mixed at a ratio of 56:44, and "▲" represents an example including a photoactive layer in which P3HT, PCBM, and P3HT-b-PTMSM are mixed at a ratio of 43.5:43.5:13.

When a reverse bias is applied, the "▲" curve of the example in which the block copolymer is applied and the silica thin film is formed around the electron donor polymer shows a lower dark current density than the "■" curve. This means that tunneling of holes is blocked by the silica thin film layer, and thus recombination in the electron acceptor layer is prevented.

Figure 5:
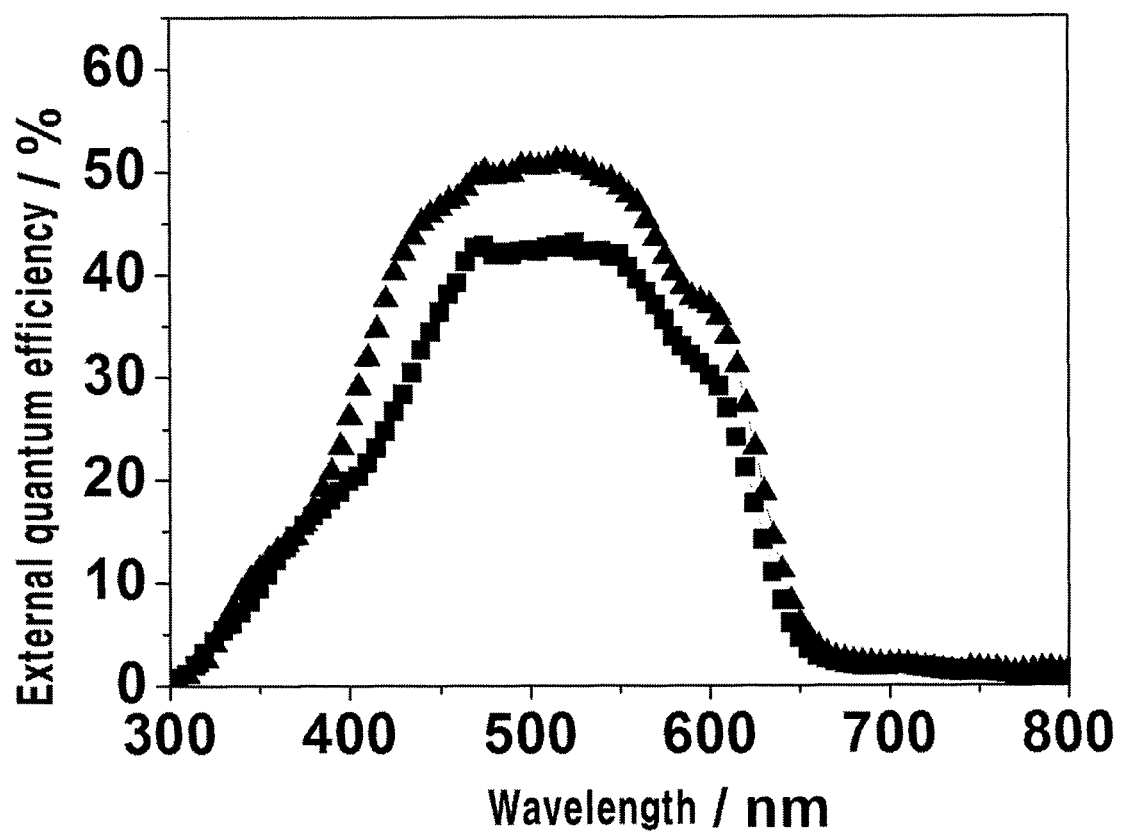
FIG. 5 is a graph showing external quantum efficiency of polymer solar cells formed according to an example of a fabrication method of the present invention.

FIG. 5 is a graph showing external quantum efficiency of polymer solar cells formed according to an example of a fabrication method of the present invention.

Referring to FIG. 5, "■" represents an example including a photoactive layer in which P3HT and PCBM are mixed at a ratio of 56:44, and "▲" represents an example including a photoactive layer in which P3HT, PCBM, and P3HT-b-PTMSM are mixed at a ratio of 43.5:43.5:13.

In FIG. 5, the "▲" curve of the example in which the block copolymer is applied and the silica thin film is formed around the electron donor polymer shows high external quantum efficiency in relatively broad wavelength bands, compared to the "■" curve. This means that tunneling of electrons and blocking of holes are effectively performed by the silica thin film, and thereby recombination in the electron acceptor layer is minimized.

According to the present invention, block copolymers including silica precursors are applied to a photoactive layer. During formation of a solution or mixing of electron donor polymers and the block copolymers, the electron donor polymers form grains by a self-assembly process to form an electron donor layer. In addition, through heat treatment, the silica precursors arranged around the electron donor layer cross-link to each other and form a silica thin film layer. Through the silica thin film layer, electrons tunnel to be transported to an electron acceptor layer. In addition, holes generated in the electron donor layer are blocked by the silica thin film layer, and move along the electron donor layer to be transported to a hole transport layer.

According to the present invention, recombination of electrons and holes generated by the electron donor layer formed to have a network structure in the photoactive layer, in the electron acceptor layer may be minimized. Accordingly, high external quantum efficiency may be achieved, and a polymer solar cell having flexibility may be fabricated through a solution process of the photoactive layer. In addition, since a role-to-role process suitable for large size fabrication is available, fabrication of a large-sized polymer solar cell and mass production are enabled.

While the example embodiments of the present invention and their advantages have been described in detail, it should be understood that various changes, substitutions, and alterations may be made herein without departing from the scope of the invention.

What is claimed is:
1. A polymer solar cell, comprising:
a lower electrode;
a hole transport layer formed on the lower electrode;
a photoactive layer formed on the hole transport layer and generating tunneling of electrons; and
an upper electrode formed on the photoactive layer, wherein the photoactive layer comprises:
- an electron donor layer consisting of grains of electron donor polymers;
- a silica thin film layer formed around the electron donor layer; and
- an electron acceptor layer in contact with the silica thin film layer.

2. The polymer solar cell of claim 1, wherein the electron donor layer has a network structure.

3. The polymer solar cell of claim 2, wherein the electron donor layer includes poly(thiophene) derivatives, poly(fluorene) derivatives, MEH-PPV, MDMO-PPV, PCPDTBT, PDTG-TPD, PBDTTT-CF, PTB7, or PCDTBT.

4. The polymer solar cell of claim 1, wherein electrons generated in the electron donor layer tunnel through the silica thin film layer to be transported to the electron acceptor layer, and
holes generated in the electron donor layer are blocked by the silica thin film layer to be transported to the hole transport layer along the electron donor layer.

5. The polymer solar cell of claim 1, wherein the silica thin film layer is formed by cross-linking of silica precursors.

6. The polymer solar cell of claim 5, wherein the silica precursor is at least one of polymers represented by the following chemical formulae:

[Chemical formula 1]

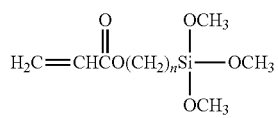

in Chemical formula 1, n represents a natural number of 1 to 3, and when the number of methoxy groups combined with the Si atom is less than 3, the other group combined with the Si element is a methyl group;

[Chemical formula 2]

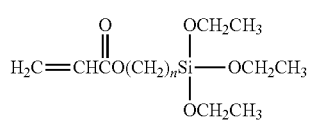

in Chemical formula 2, n represents a natural number of 1 to 3, and when the number of ethoxy groups combined with the Si atom is less than 3, the other group combined with the Si element is a methyl group;

[Chemical formula 3]

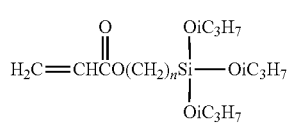

in Chemical formula 3, n represents a natural number of 1 to 3, and when the number of isopropoxy groups combined with the Si atom is less than 3, the other group combined with the Si element is a methyl group;

[Chemical formula 4]

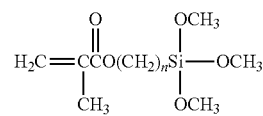

in Chemical formula 4, n represents a natural number of 1 to 3, and when the number of methoxy groups combined with the Si atom is less than 3, the other group combined with the Si element is a methyl group;

[Chemical formula 5]

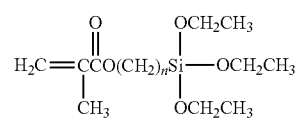

in Chemical formula 5, n represents a natural number of 1 to 3, and when the number of ethoxy groups combined with the Si atom is less than 3, the other group combined with the Si element is a methyl group;

[Chemical formula 6]

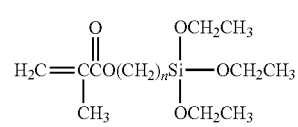

in Chemical formula 6, n represents a natural number of 1 to 3, and when the number of isopropoxy groups combined with the Si atom is less than 3, the other group combined with the Si element is a methyl group;

[Chemical formula 7]

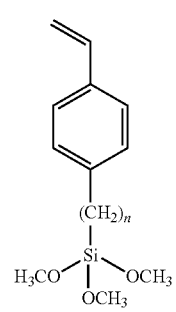

in Chemical formula 7, n represents a natural number of 1 to 3; and

[Chemical formula 8]

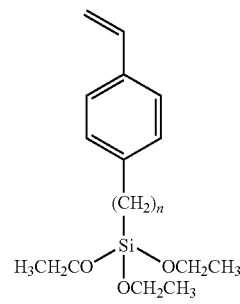

in Chemical formula 8, n represents a natural number of 1 to 3, wherein an allyl-based silica precursor is represented by the following chemical formulae:

$$H_2C=CH(CH_2)_nSi(OCH_3)_3 \quad \text{[Chemical formula 9]}$$

in Chemical formula 9, n represents a natural number of 1 to 12, and when the number of methoxy groups combined with the Si atom is less than 3, the other group combined with the Si element is a methyl group;

$$H_2C=CH(CH_2)_nSi(OCH_2CH_3)_3 \quad \text{[Chemical formula 10]}$$

in Chemical formula 10, n represents a natural number of 1 to 12, and when the number of ethoxy groups combined with the Si atom is less than 3, the other group combined with the Si element is a methyl group;

$$H_2C=CHCH_2O(CH_2)_nSi(OCH_3)_3 \quad \text{[Chemical formula 11]}$$

in Chemical formula 11, n represents a natural number of 1 to 12, and when the number of methoxy groups combined with the Si atom is less than 3, the other group combined with the Si element is a methyl group; and $$H_2C=CHCH_2O(CH_2)_nSi(OCH_2CH_3)_3 \quad \text{[Chemical formula 12]}$$

in Chemical formula 12, n represents a natural number of 1 to 12, and when the number of ethoxy groups combined with the Si atom is less than 3, the other group combined with the Si element is a methyl group, and wherein an isocyanate-based silica precursor is represented by the following chemical formulae:

$$NCO-(CH_2)_nSi(OCH_3)_3 \quad \text{[Chemical formula 13]}$$

in Chemical formula 13, n represents a natural number of 1 to 12, and when the number of methoxy groups combined with the Si atom is less than 3, the other group combined with the Si element is a methyl group; and $$NCO-(CH_2)_nSi(OCH_2CH_3)_3 \quad \text{[Chemical formula 14]}$$

in Chemical formula 14, n represents a natural number of 1 to 12, and when the number of ethoxy groups combined with the Si atom is less than 3, the other group combined with the Si element is a methyl group.

* * * * *